US011296499B2

(12) United States Patent
Delshadpour et al.

(10) Patent No.: US 11,296,499 B2
(45) Date of Patent: Apr. 5, 2022

(54) DISCHARGE PROTECTION CIRCUIT AND METHOD FOR OPERATING A DISCHARGE PROTECTION CIRCUIT

(71) Applicant: NXP B.V., Eindhoven (NL)

(72) Inventors: Siamak Delshadpour, Phoenix, AZ (US); Guido Wouter Willem Quax, Utrecht (NL); Peter Christiaans, Mountain View, CA (US)

(73) Assignee: NXP B.V., Eindhoven (NL)

( * ) Notice: Subject to any disclaimer, the term of this patent is extended or adjusted under 35 U.S.C. 154(b) by 586 days.

(21) Appl. No.: 16/177,323

(22) Filed: Oct. 31, 2018

(65) Prior Publication Data

US 2020/0136382 A1  Apr. 30, 2020

(51) Int. Cl.
*H02H 9/04* (2006.01)
*H01L 27/02* (2006.01)
*H01R 13/648* (2006.01)

(52) U.S. Cl.
CPC ......... *H02H 9/046* (2013.01); *H01L 27/0248* (2013.01); *H01R 13/6485* (2013.01)

(58) Field of Classification Search
CPC . H02H 9/046; H01L 27/0248; H01L 27/0251; H01R 13/6485
USPC .......................................................... 361/56
See application file for complete search history.

(56) References Cited

U.S. PATENT DOCUMENTS

| | | | |
|---|---|---|---|
| 4,719,374 A * | 1/1988 | Bialo | H03K 17/6871 327/430 |
| 5,646,808 A | 7/1997 | Nakayama | |
| 5,808,502 A * | 9/1998 | Hui | G11C 7/1006 327/333 |
| 5,838,146 A | 11/1998 | Singer | |
| 5,909,135 A | 6/1999 | Baldwin et al. | |
| 6,724,592 B1 | 4/2004 | Tong et al. | |
| 6,738,242 B1 | 5/2004 | Kwong et al. | |
| 8,493,097 B2 | 7/2013 | Dong et al. | |
| 9,130,553 B2 | 9/2015 | Huisman et al. | |
| 9,620,957 B2 | 4/2017 | Su et al. | |
| 9,716,016 B2 | 7/2017 | Hsu | |
| 9,870,939 B2 | 1/2018 | Linewih et al. | |
| 9,893,516 B2 | 2/2018 | Jou et al. | |
| 2008/0259511 A1 * | 10/2008 | Worley | H01L 27/0266 361/56 |
| 2013/0307576 A1 | 11/2013 | Ilkov et al. | |

(Continued)

FOREIGN PATENT DOCUMENTS

WO    WO 2007/046015 A1    4/2007

OTHER PUBLICATIONS

Microchip, AN1953, "Introduction to USB Type-C™", 2015 Microchip Technology Inc.

(Continued)

*Primary Examiner* — Kevin J Comber

(57) ABSTRACT

Embodiments of a method, a circuit and a system are disclosed. In an embodiment, a discharge protection circuit is disclosed. The discharge protection circuit includes a switch having a capacitive coupling between a gate and a drain of the switch, wherein the capacitive coupling facilitates a capacitively coupled current. The discharge protection circuit further includes a gate network including at least the gate of the switch, a gate control element and a resistor connected to the gate and the gate control element. In addition, the discharge protection circuit includes an electrostatic discharge rail that connects to a diode that is coupled to the gate and the resistor, wherein the capacitive coupling facilitates sinking of at least a part of an electrostatic discharge current via the gate network.

18 Claims, 10 Drawing Sheets

(56) References Cited

U.S. PATENT DOCUMENTS

| | | | |
|---|---|---|---|
| 2015/0002965 A1* | 1/2015 | Hayashi | H01L 27/0266 361/56 |
| 2016/0094027 A1 | 3/2016 | Arakawa et al. | |
| 2016/0372921 A1 | 12/2016 | Lai et al. | |
| 2017/0012036 A1 | 1/2017 | Quax et al. | |
| 2017/0012037 A1 | 1/2017 | De Raad et al. | |
| 2018/0247927 A1 | 8/2018 | Lai et al. | |
| 2018/0247928 A1 | 8/2018 | Lai et al. | |
| 2018/0269199 A1 | 9/2018 | Jimenez et al. | |
| 2018/0286855 A1 | 10/2018 | Lai et al. | |
| 2018/0287376 A1 | 10/2018 | De Raad | |
| 2018/0287378 A1 | 10/2018 | Sithanandam | |
| 2019/0165570 A1 | 5/2019 | Zhang et al. | |

OTHER PUBLICATIONS

Gayathri Vasudevan, "USB Type-C and power delivery 101 Ports and connections", May 8, 2018; https://www.embedded.com/print/4458380.

Nate Enos and Brian Gosselin, "A primer on USB Type-C and Power Delivery applications and requirements", 2018, Texas Instruments Incorporated.

Rogers, Andrew. "Introduction to USB Type-C", Microchip, AN1953, Microchip Technology Inc., 2015.

Vasudevan, Gayathri. "USB Type-C and power delivery 101 Ports and connections", May 8, 2018; https://www.embedded.com/print/4458380.

Enos, Nate et al. "A primer on USB Type-C and Power Delivery applications and requirements", Texas Instruments Incorporated, Nov. 2016, Dallas, Texas.

Yucheng. "What's the role of CC pin in Type-C solution", 8-bit MCU Knowledge Base, Silicon Labs Support & Community, Silicon Laboratories, Sep. 25, 2016, online access: https://www.silabs.com/community/mcu/8-bit/knowledge-base.entry.html/2016/09/26/what_s_the_role_ofc-kQYe.

* cited by examiner

DISCHARGE PROTECTION CIRCUIT AND METHOD FOR OPERATING A DISCHARGE PROTECTION CIRCUIT

BACKGROUND

Electrostatic discharge involves a sudden flow of electricity, which can be caused by a buildup of static electricity. Electrostatic discharge protection circuits can be used to shunt electrostatic discharge currents to prevent thermal damage to electronic devices. For example, an electrostatic discharge protection device can be integrated with an electrical device, such as an integrated circuit (IC) chip, to provide a low impedance channel that prevents thermal damage to components of the electrical device. The operating characteristics of an electrostatic discharge protection device (e.g., the electrostatic discharge reaction time for activating the electrostatic discharge protection device to shunt the electrostatic discharge current) can affect the performance of the electrostatic discharge protection device.

Integrated circuits, which are used as an interface to the 'outside world', are often subject to heavy system level electrostatic discharge requirements. Examples are the IEC (International Electrotechnical Commission) 61000-4-2 ('system level stress') or the IEC 61000-4-5 ('surge stress') standards. IEC 61000-4-2, in particular, is the International Electrotechnical Commission's immunity standard on Electrostatic Discharge. The publication is one of the basic EMC (electromagnetic compatibility) standards of the IEC 61000-4 series. The European equivalent of the standard is referred to as EN 61000-4-2. IEC 61000-4-5 is the International Electrotechnical Commission's international standard on surge immunity. That is, power lines may be hit by surges from power switches and from lightning, and the standard defines test set-up and procedures, and classification levels.

In addition to heavy system level electrostatic discharge applications, such electrostatic discharge requirements can also apply to powered IC chips (e.g., the IC chip should be able to sink the electrostatic discharge stress when powered up). Together with these types of electrostatic discharge requirements, some IC chips may have a high DC voltage tolerance specification. For example, a Type-C USB connector (also referred to as a "Type-C connector") may be tolerant to voltages exceeding, for example, 20V DC. Note that the acronym "USB" as utilized herein refers to "Universal Serial Bus" and is an industry standard that establishes specifications for cables, connectors and protocols for connection, communication and power supply between personal computers and their peripheral devices.

An IC chip may include a switch functionality, typically implemented provided by a switch MOS (Metal-Oxide-Semiconductor) device with the drain on one data terminal, and the source on the other data terminal. An example is the CC (Configuration Channel) line in USB applications. The 'outside world' facing terminals in such chips often connect to the drain of an HV (High Voltage) MOS device, and the source to a terminal with low to minimal electrostatic discharge risk.

Since there is a possibility that the switch is in a conducting state when the electrostatic discharge stress occurs (e.g., due to the power-up requirement), the electrostatic discharge current can pass the switch and reach the source side. Fast electrostatic discharge transients may lead to gate lifting as well (even when the switch is non-conducting) and charge the source node. This situation can be risky, because the circuitry at the source side of the switch can include low voltage circuitry, which is vulnerable to failure at a high voltage.

A pull-down circuit can be added at the source side to ameliorate these risks. If comparators are used, however, the configuration may be too slow to pull down the source node. Dedicated electrostatic discharge protection circuitry can be used in electronic devices on the source side of a switch as well (these can react fast) for additional electrostatic discharge protection. The electrostatic discharge protection circuitry, however, can take up a great deal of area. This additional circuitry on the source side may also result in additional capacitance on the data line and can compromise bandwidth performance.

SUMMARY

Embodiments of a method, a circuit and a system are disclosed. In an embodiment, a discharge protection circuit is disclosed. The discharge protection circuit includes a switch having a capacitive coupling between a gate and a drain of the switch, wherein the capacitive coupling facilitates a capacitively coupled current. The discharge protection circuit further includes a gate network including at least the gate of the switch, a gate control element and a resistor connected to the gate and the gate control element. In addition, the discharge protection circuit includes an electrostatic discharge rail that connects to a diode that is coupled to the gate and the resistor, wherein the capacitive coupling facilitates sinking of at least a part of an electrostatic discharge current via the gate network.

In an embodiment of the discharge protection circuit, the gate network can include an AC-triggered electrostatic discharge protection element that sinks the capacitively coupled current.

In an embodiment of the discharge protection circuit, the gate network can include a DC-triggered electrostatic discharge protection element that sinks the capacitively coupled current.

In an embodiment, the discharge protection circuit can further include an indirect clamping of a source side of the switch.

In an embodiment, the switch of the discharge protection circuit can include an MOS device.

In an embodiment, the electrostatic discharge rail of the discharge protection circuit can include a shared rail that is shareable by at least one other circuit.

In an embodiment, the capacitive coupling of the discharge protection circuit can include one or more capacitors.

A method of operating a discharge protection circuit is also disclosed. The method involves producing a capacitively coupled current utilizing a capacitive coupling of a switch configured with the capacitive coupling between a gate and a drain of the switch, and sinking at least a part of an electrostatic discharge current via a gate network comprising at least the gate of the switch, a gate control element and a resistor connected to the gate and the gate control element, wherein the electrostatic discharge current is facilitated by an electrostatic discharge rail that connects to a diode coupled to the gate and the resistor.

In an embodiment of the method, the gate network can include an AC-triggered electrostatic discharge protection element that sinks the capacitively coupled current.

In an embodiment of the method, the gate network can include a DC-triggered electrostatic discharge protection element that sinks the capacitively coupled current.

In an embodiment of the method, an indirect clamping of a source side of the switch can be utilized.

In an embodiment of the method, the switch can include an MOS device.

In an embodiment of the method, the electrostatic discharge rail can include a shared rail that is shareable by at least one other circuit.

In an embodiment of the method, the capacitive coupling can include one or more capacitors.

A discharge protection system is also disclosed. The discharge protection system includes a circuit comprising a switch that includes at least one transistor, wherein the switch comprises a capacitive coupling between a gate and a drain of the at least one transistor, wherein the capacitive coupling facilitates a capacitively coupled current. The discharge protection system also includes a gate network comprising at least the gate of the at least one transistor, a gate control element and a resistor connected to the gate and the gate control element. The discharge protection system further includes an electrostatic discharge rail that connects to at least one diode coupled to the gate and the resistor, wherein the capacitive coupling facilitates sinking of at least a part of an electrostatic discharge current via the gate network.

In an embodiment of the discharge protection system, the gate network includes an electrostatic discharge protection element that sinks the capacitively coupled current.

In an embodiment of the discharge protection system, an indirect clamping of a source side of the at least one transistor can include an MOS device.

In an embodiment of the discharge protection system, the MOS device can include at least one of an HV (High Voltage) MOS device and an LV (Low Voltage) MOS device.

In an embodiment of the discharge protection system, the MOS device can include a plurality of MOS devices in a back-to-back arrangement that includes two or more MOS devices.

In an embodiment of the discharge protection system, the electrostatic discharge rail can include a shared rail that is shareable by one or more other circuits and the capacitive coupling can include one or more capacitors.

BRIEF DESCRIPTION OF THE DRAWINGS

Throughout the description, similar reference numbers may be used to identify similar elements.

DETAILED DESCRIPTION

Figure 1A:
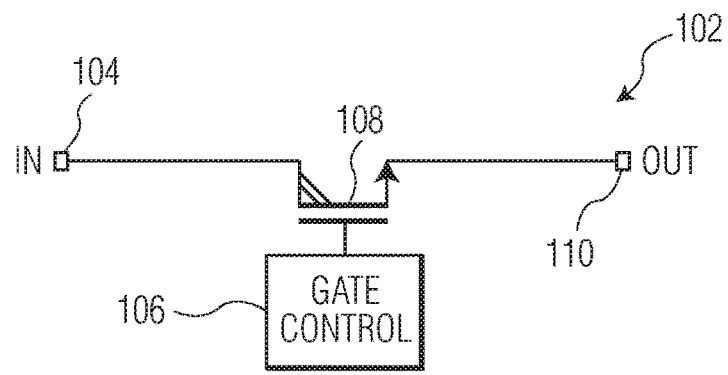
FIG. 1A depicts a schematic diagram of a high speed HV switch circuit with gate control.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, and is merely representative of various embodiments. While the various aspects of the embodiments are presented in drawings, the drawings are not necessarily drawn to scale unless specifically indicated.

The embodiments may be implemented in other specific forms while not departing from their spirit or characteristics. The described embodiments are to be considered in all respects only as illustrative and not restrictive. The scope of the invention is, therefore, indicated by the appended claims rather than by this detailed description. All changes, which come within the meaning and range of equivalency of the claims, are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may or may not refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Several aspects are presented with reference to various systems, methods and devices. These systems, methods and devices are described in the following detailed description and illustrated in the accompanying drawings by various blocks, modules, components, circuits, steps, operations, processes, algorithms, engines, applications, etc. (which can be individually or collectively referred to as "elements"). These elements may be implemented using electronic hardware, computer software, or any combination thereof. Whether such elements are implemented as hardware or software depends upon the particular application and design constraints imposed on the overall system.

The disclosed solution provides an ESD (electrostatic discharge) protection architecture for switches that may be subject to system level stresses and fast transients (e.g., for high speed, power, and protection switches). As will be discussed in greater detail herein, a capacitive coupling (e.g., one or more capacitors) can be located between the gate and drain of a switch so as to sink a part of the electrostatic discharge current via a gate network ("gate net") that includes elements such as a gate control circuit, a gate control resistor, the gate of the switch (e.g., a transistor gate) along with other features such as a gate load. Note that as utilized herein, the acronym "ESD" and the phases "electrostatic discharge" and "Electrostatic Discharge" can be utilized interchangeably with one another to refer to the same feature.

The disclosed embodiments are particularly effective for fast electrostatic discharge events, such as, for example, IEC 61000-4-2, because the coupling to the gate net is then the strongest. The gate net can include the use of AC (Alternating Current)-triggered or DC (Direct Current)-triggered electrostatic discharge protection elements to sink the capacitively coupled current, which results from the use of the aforementioned capacitor(s). The electrostatic discharge protection features may not interfere with the functional operation of the gate net. As will be discussed in greater detail herein, one important benefit of this approach is that the disclosed electrostatic discharge architecture can include an indirect clamping of the source side of the switch (since the source voltage may not rise above the clamping voltage of the gate minus a threshold voltage, Vth). Another benefit of this approach is that the disclosed embodiments may not load the data line (i.e., the drain/source side of the switch), and therefore may not compromise the (high) bandwidth performance of the switch.

FIGS. 1A to 1E depict a group of schematic diagrams, which illustrate different circuit configurations with dedicated electrostatic discharge diodes and rail clamps. Depending on the particular electrostatic discharge strategy employed, the rail clamps can be shared. In addition, diode-connector resistors can be used to pre-charge the rail clamp. Note that in FIGS. 1A to 1E, identical or similar parts or elements are generally indicated by identical reference numerals.

FIG. 1A depicts a schematic diagram of an HV (high speed) switch circuit 102 with gate control facilitated by a gate control circuit 106. The HV switch circuit 102 includes an input pin 104 that connects to a transistor 108 (e.g., NMOS transistor) that in turn connects to an output pin 110 and the gate control circuit 106. Note that as utilized herein, the term "switch circuit" may also be referred to simply as a "switch". That is, the terms "switch circuit" and "switch" may be utilized interchangeably to refer to the same general feature or element.

Figure 1B:
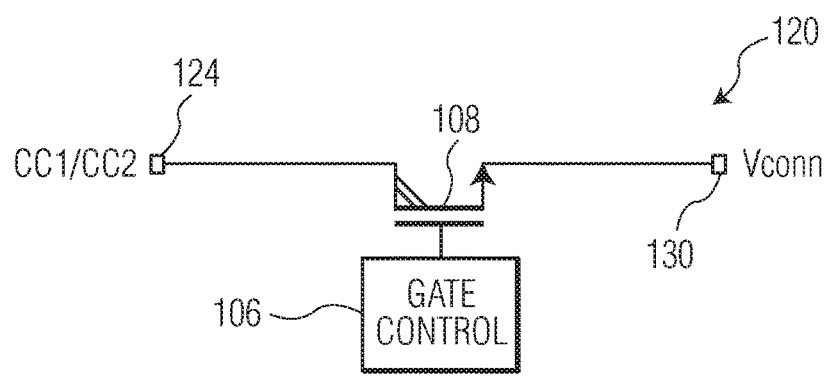
FIG. 1B depicts a schematic diagram of a $V_{CONN}$ switch circuit with gate control.

FIG. 1B depicts a schematic diagram of a $V_{CONN}$ switch circuit 120 with gate control facilitated by the gate control circuit 106. The $V_{CONN}$ switch circuit 120 includes an input pin 124 and an output pin 130 that are coupled to the transistor 108. The gate control circuit 106 can also be coupled to the transistor 108 in the configuration of switch circuit 120. Note that the input pin 124 can be referred to as a "CC1/CC2" input pin or simply a CC1/CC2 pin, and the output pin 124 can be referred to as a "$V_{CONN}$" output pin or simply a $V_{CONN}$ pin.

As utilized herein, "CC1/CC2" or simply "CC1" and "CC2" can refer to a "CC" (Configuration Channel) line of a USB Type-C connector subsystem. CC1 and CC2 are thus particular types of pins typically utilized in the context of a USB Type-C solution. CC1/CC2 provides a configuration channel capable of facilitating, for example, the detection of USB ports (e.g., a source to a sink), resolve cable orientation and twist connections to establish USB data bus routing, establishing data roles between two or more attached ports, discovering and configuring, for example, USB type-C current modes or USB power delivery, configuring $V_{CONN}$, and discovering and configuring optional alternative and accessory modes.

Figure 1C:
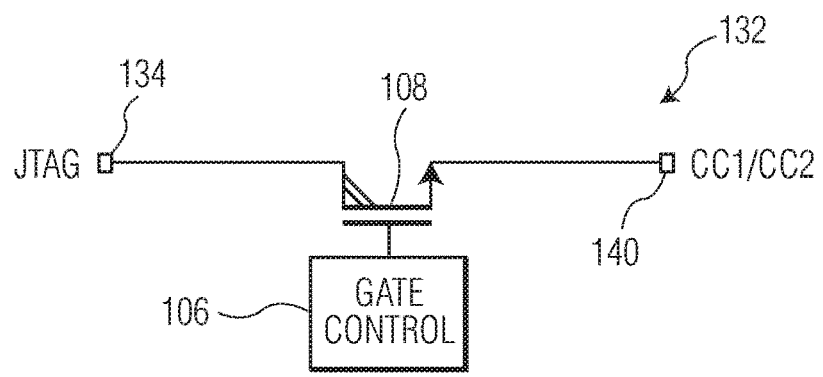
FIG. 1C depicts a schematic diagram of a JTAG (Joint Test Action Group) switch circuit with gate control.

FIG. 1C depicts a schematic diagram of a JTAG (Joint Test Action Group) switch circuit 132 with gate control facilitated by the gate control circuit 106. The JTAG switch circuit 132 includes a JTAG input pin 134 and a CC1/CC2 output pin 140 coupled to the transistor 108. The gate control circuit 106 is coupled to the transistor 108. Note that the JTAG as utilized herein refers to "Joint Test Action Group (named after the Joint Test Action Group, which codified it) is an industry standard for verifying designs and testing printed circuit boards after manufacture.

Figure 1D:
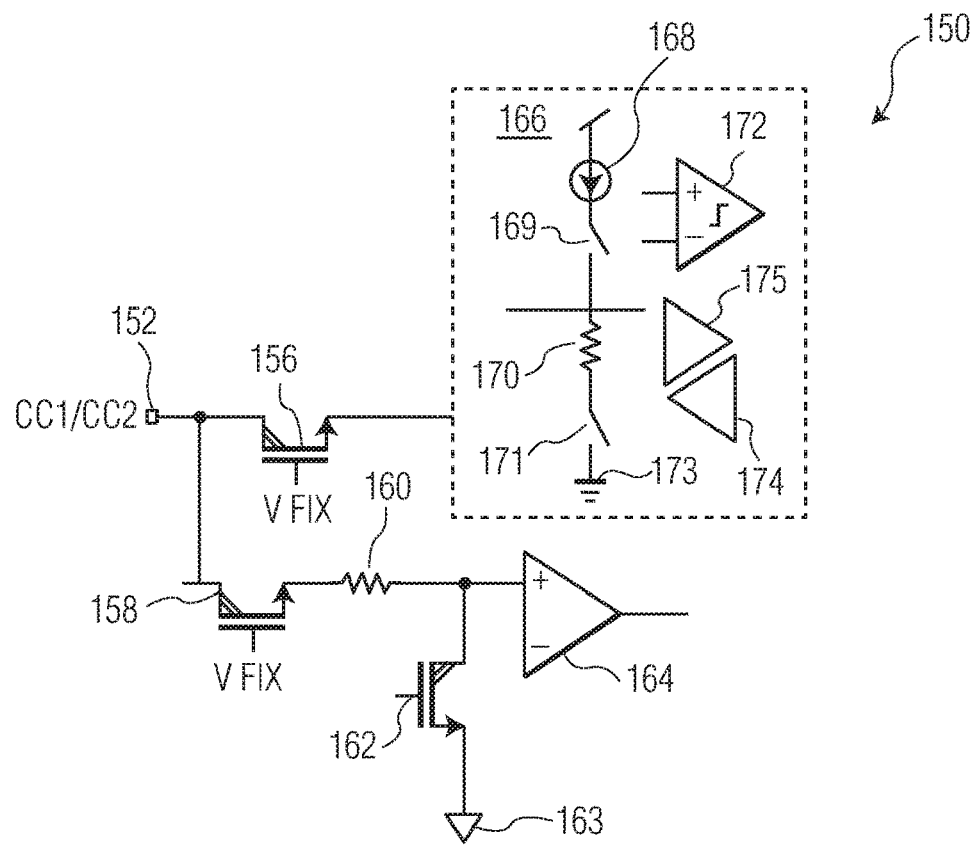
FIG. 1D depicts a schematic diagram of a circuit having a detection/termination and FRS (Fast Role Swap) configuration.

FIG. 1D depicts a schematic diagram of a circuit 150 having a detection/termination and FRS (Fast Role Swap) configuration. The circuit 150 includes a CC1/CC2 input pin 152 coupled to a transistor 156 and a transistor 158. Each transistor 156 and transistor 158 can include a respective gate coupled to a fixed voltage (V FIX). The transistor 158 can be further connected to a resistor 160 that in turn connects electronically to a transistor 162 and an amplifier 164. The transistor 162 further connects to ground 163.

Note that as utilized herein, the term FRS refers to the "Fast Role Swap" feature, which is defined in the USB Power Delivery specification (USB PD) to support the USB's goal of a flexible, low-voltage dc power-distribution system by allowing for a seamless power transfer and continued system operation following an unexpected loss of power. The "detection/termination" aspect of circuit 150 may involve the detection and termination of, for example, USB ports, while the FRS aspect of circuit 150 can support the "Fast Role Swap" feature, as discussed above.

The transistor 156 can also be electronically coupled to a sub-circuit 166 that can include a current-source 168 that connects to a switch 169 that in turn can connect to a resistor 170 coupled to a switch 171 connect to ground 173. In the circuit 150 shown in FIG. 1D, the transistors 156, 158, and 162 can be implemented as, for example, NMOS transistors or other types of MOS devices.

The sub-circuit 166 can optionally include an operational amplifier 172 and buffers 174 and 175. Although not shown as tied directly to either the current source 168 or 170 in the sub-circuit 166 or any other specific circuit elements, it should be appreciated that the operational amplifier 172 and the buffers 174 and 175 can be electronically incorporated into the sub-circuit 166 as may be needed and are shown as "separate" from the other elements for this reason.

Figure 1E:
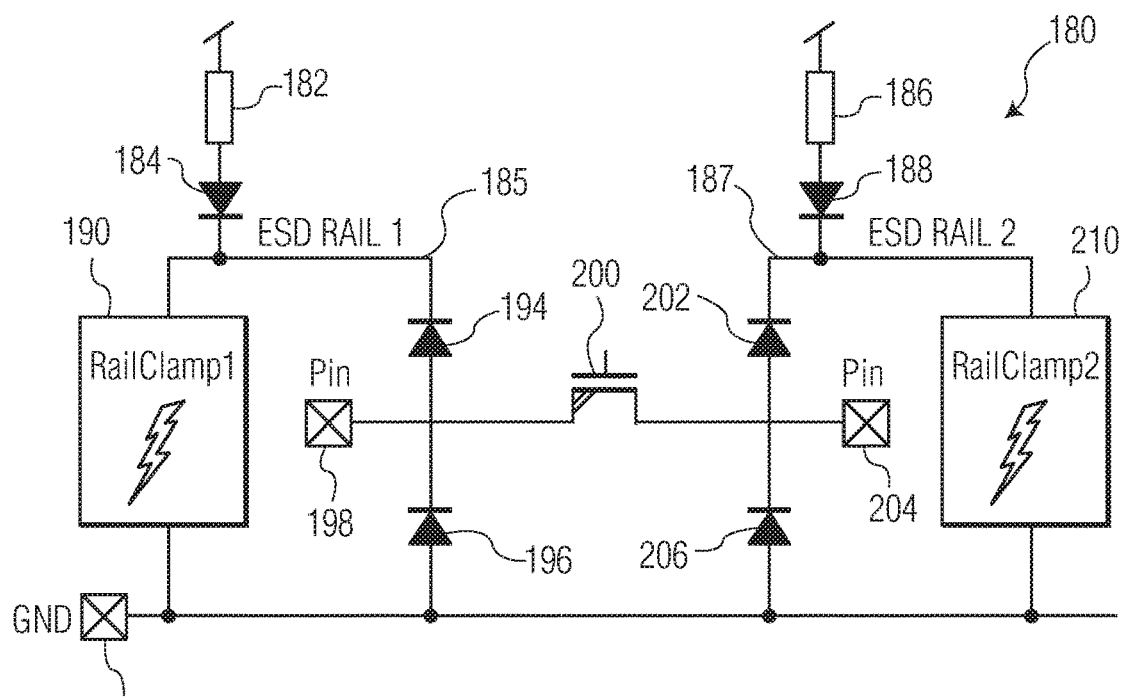
FIG. 1E depicts a schematic diagram of a circuit that includes a switch with two pins, electrostatic discharge diodes, and electrostatic discharge rails.

FIG. 1E depicts a schematic diagram of a circuit 180 that includes a switch with two pins 198 and 204, diodes 184, 188, 194, 196, 202, 206 and respective first and second electrostatic discharge rails 185 and 187. The diodes 184, 188, 194, 196, 202, 206 can function as electrostatic discharge diodes. The output of the diode 184 connects to the first electrostatic discharge rail 185 and to a first rail clamp 190. The input of the diode 184 is coupled to a voltage source 182. The output of the diode 194 can be coupled to the electrostatic discharge rail 185 and the output of the diode 202 can be coupled to the second electrostatic discharge rail 187. The output of the diode 188 can be coupled to the second rail clamp 210, the second electrostatic discharge rail 187 and the output of the diode 202. The input to the diode 188 can be coupled to a voltage source 186.

The output of the diode 196 can connect to the input of the diode 194, the pin 198, and a transistor 200. Similarly, the output of diode 206 can connect to the transistor 200, the input to diode 202, and the pin 204. In addition, the input to the diode 196, the input to the diode 206, and the first rail clamp 190 and the second rail clamp 210 can further connect to ground 192.

FIGS. 1A to 1E thus depict a summary of different circuit that may require at least some form of electrostatic discharge protection. In general, in the connector side of the illustrated transistor (e.g., such as transistor 108 shown in FIGS. 1A to 1C, transistors 156, 158 and 162 shown in FIG. 1D, and transistor 200 shown in FIG. 1E), which constitute the drain of a high voltage NMOS, there will be negative electrostatic discharge protection to ground, and positive electrostatic discharge protection with respect to the first rail clamp 190 or the second rail clamp 192 (e.g., which in some configurations can each be implemented in the context of a dedicated or shared ESD rail).

The source side of an EDNMOS (Enhancement and Depletion NMOS) transistor, for example, can include another pin (e.g. such as in the high speed HV switch circuit 102, the JTAG switch circuit 132 or the $V_{CONN}$ switch circuit 120). Note that "EDNMOS" refers to a type of MOS device having enhancement and depletion modes. In this case, the drain can be connected to the pin and can be protected by electrostatic discharge diodes depending on the requirements (e.g., negative and positive ESD). Some low voltage tolerant circuitries (e.g., such as USB Type-C RX/TX, CC Detection/Termination, etc.) may include configurations in which the drain is connected to another circuit. Thus, the gate of the switch and the gate control circuit can be protected. This means that a fast clamping mechanism may be used. The drain of the switch and whatever is connected to it may also use protection.

Pins that may need extra protection can include, for example, CC1 and CC2 pins such as the CC1/CC2 pin 124 shown in FIG. 1B, the CC1/CC2 pin 140 illustrated in FIG. 1C, and the CC1/CC2 pin 152 depicted in FIG. 1D. In some cases, a $V_{CONN}$ switch, CC Detection/termination components, BMC (bi-phase marked coding) and PHY (Physical layer) elements, FRS elements, and JTAG switches can be directly connected to these pins. In some configurations of the circuit 103, circuit elements can be protected using, for example, a source follower EDNMOS transistor to ensure that higher signals are clamped to ~Vgate-Vth (i.e., gate voltage to threshold voltage).

SBU, DS+/−(High speed pins) may also require extra protection in some instances. In these cases, EDNMOS devices, for example, can be utilized as high-speed switches to tolerate the higher voltage. Although in this situation the drain is generally safe, the source and gate may use additional protection.

In general, to provide consistent conditions across a variety of different circuits, a high voltage NMOS (e.g., EDNMOS) can be used as a protection element, either in the form of a switch (e.g., such $V_{CONN}$, JTAG, SBU and data switches) or in the form of a source follower that clamps the drain voltage to gate voltage minus Vth (i.e., threshold voltage). Because different voltage levels and electrostatic discharge requirements may be needed for different pins, consistent solutions may be required for a variety of circuit architectures. Such solutions, which are discussed in greater detail herein, can lower the complexity and risks associated with electrostatic discharge protection devices.

Figure 2A:
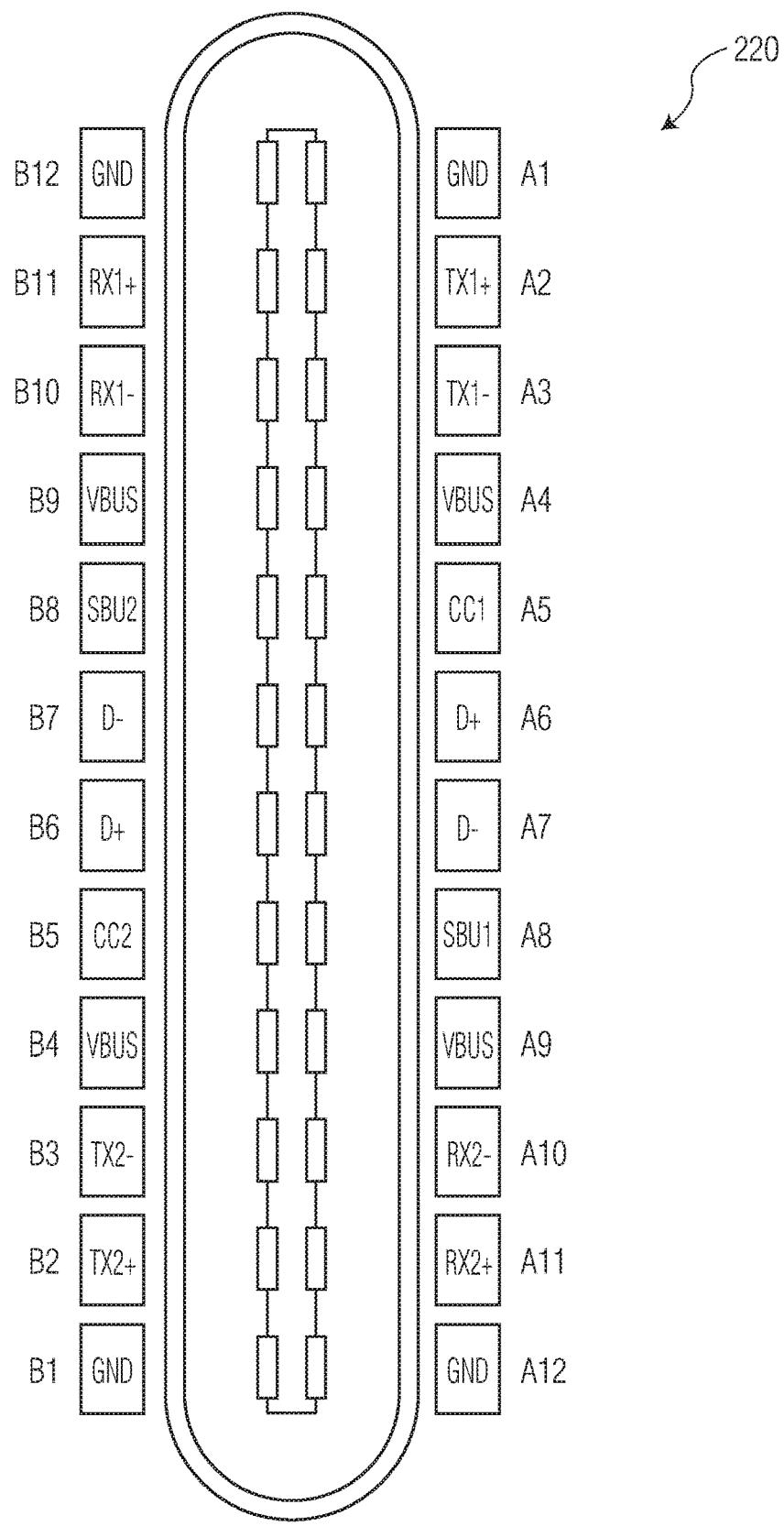
FIG. 2A depicts a schematic diagram of a Type-C connector.

FIG. 2A depicts a schematic diagram of a Type-C connector 220 with pins. A fast transient can occur on any Type-C connector signal. Some of the pins "may" be used for different functionalities. For example, Vbus (i.e., bus voltage) may be used for a power delivery purpose in a sink mode or a source mode. CC1 and CC2 can be used as termination/detection pins and $V_{CONN}$ can be used for power delivery (e.g., a power delivery pin). Note that "CC" refers to a Type-C connector pin and "CC1" refers a first Type-C connector pin and "CC2" refers to a second Type-C connector pin.

Figure 2B:
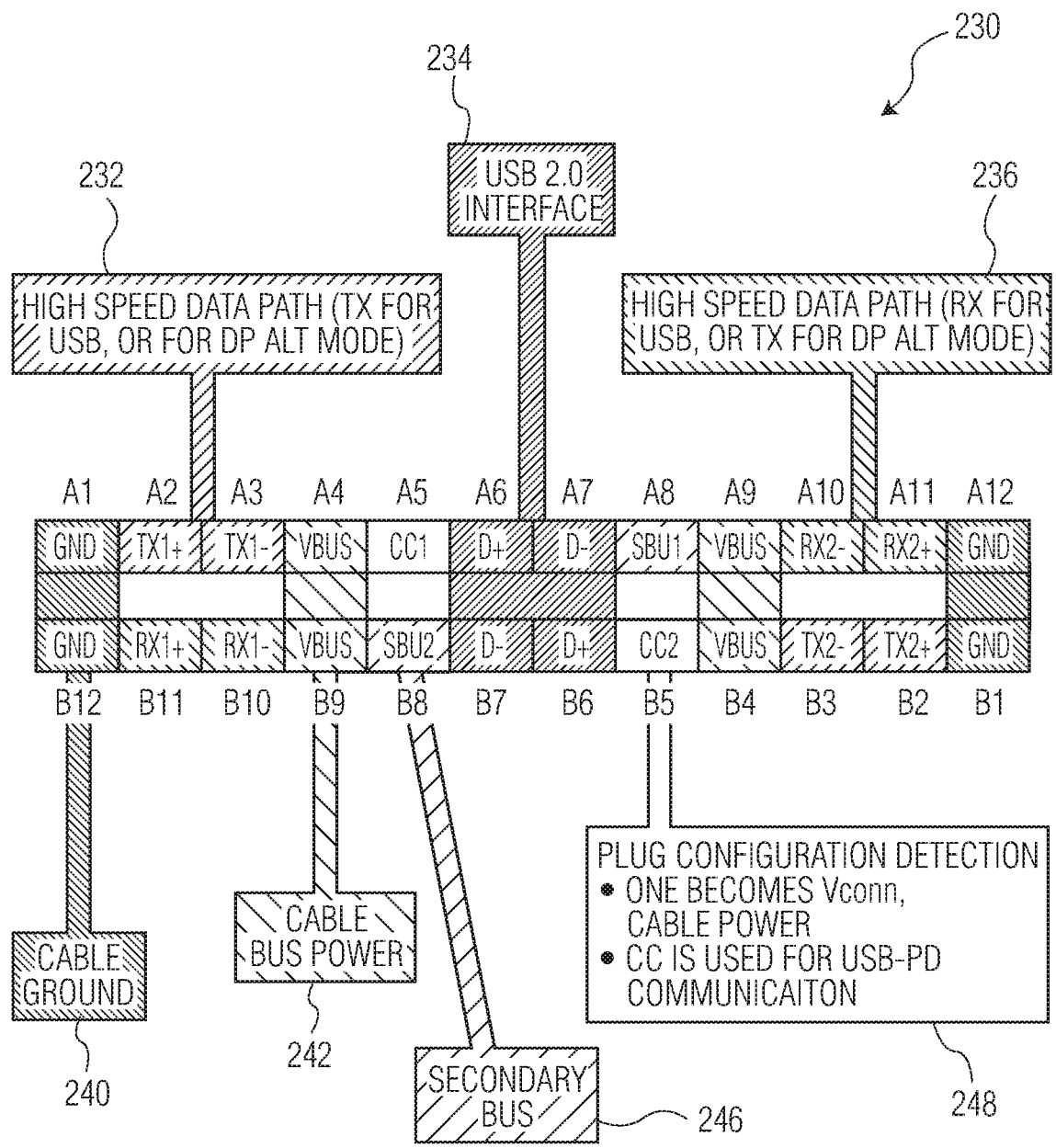
FIG. 2B shows the functionality of some of the connected blocks to Type-C connector pins, which can be protected according to the disclosed electrostatic discharge protection approach.

FIG. 2B shows the functionality of some of the connected blocks to Type-C connector pins, which can be protected according to the disclosed ESD protection approach. Each simple block shows the pin/pins used for the desired functionality.

For example, block 232 indicates a high-speed data path (e.g., TX for USB, or for DP Alt Mode). Block 234 represents a USB 2.0 interface, and block 236 indicates a high-speed data path (e.g., RX for USB, or TX for DP Alt Mode). Note that "TX" refers to "transmit" and "RX" refers to "receive". Block 240 represents a ground cable, and block 242 indicates cable bus power. Block 246 represents a secondary bus and block 248 indicates plug configuration detection capabilities $V_{CONN}$, cable power and CC adapted for use in USB-PD (USB Power Delivery) communication. The example connector pins architecture 230 shown in FIG. 2 demonstrates that pins such as CC1/CC2 and SBU (Side Band Use), DS (Digital Signal)+/1 (High Speed Pins) can require extra electrostatic discharge protection.

In general, to ensure that all conditions are similar, a high voltage element such as, for example, a high voltage NMOS (EDNMOS), can be used as the protection mechanism in the next stage. This protection feature can be provided either in the form of a switch (e.g., $V_{CONN}$, JTAG, SBU and data switches) or in form of a source follower that clamps the drain voltage to the transistor gate voltage minus Vth (e.g., threshold voltage). Because there are different voltage levels and electrostatic discharge requirements for different pins, a solution for different circuitries is desired. This solution, which is disclosed herein, can lower the complexity of the electrostatic discharge protection circuit and can also be easily implemented.

Figure 3A:
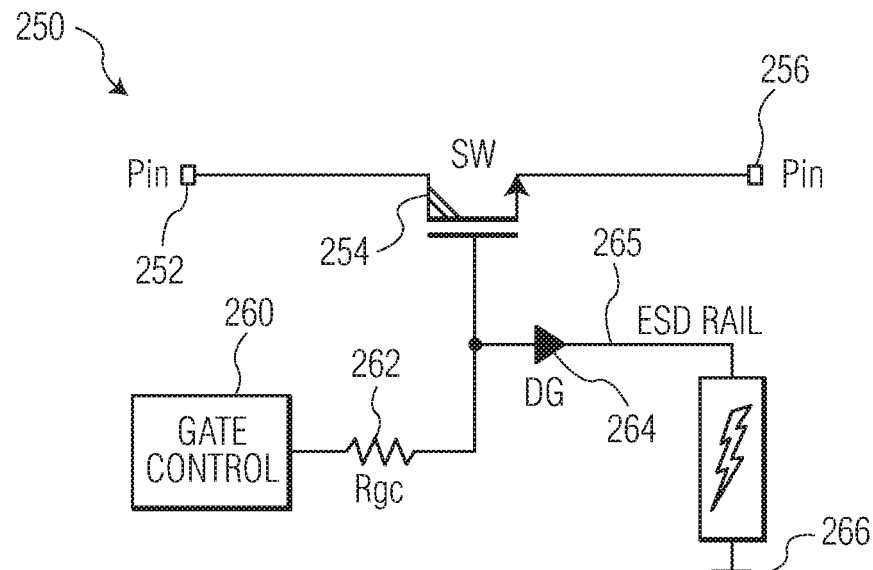
FIG. 3A and FIG. 3B depict schematic diagrams illustrating switch circuits having configurations that include a clamped diode with shared or dedicated electrostatic discharge rails.
Figure 3B:
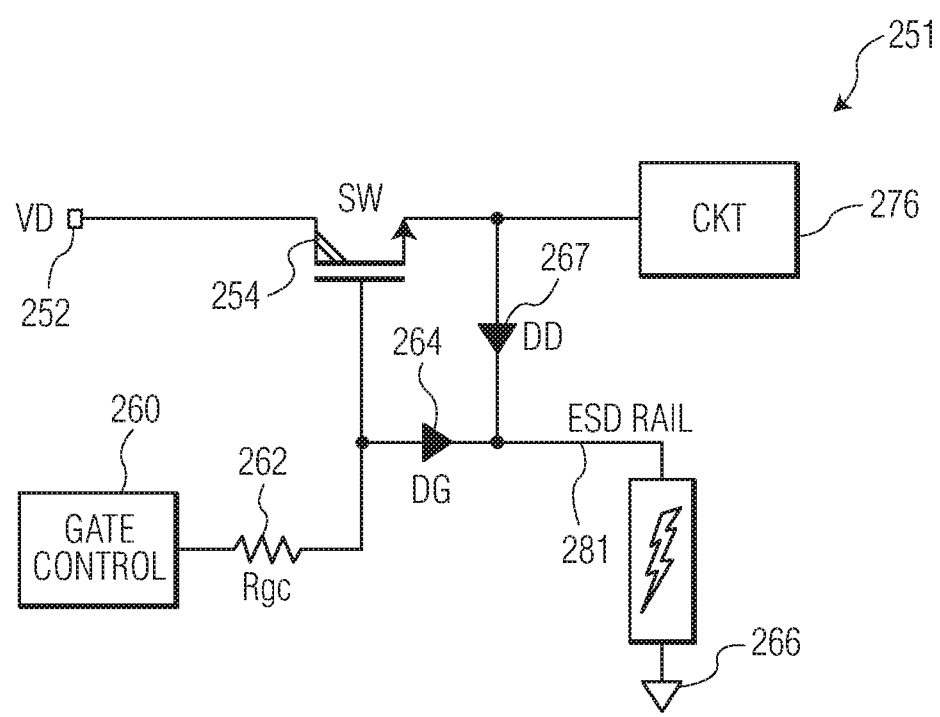

FIGS. 3A-3B depict schematic diagrams illustrating a switch circuit 250 and a switch circuit 251 having respective circuit configurations that include a clamped diode with shared or dedicated electrostatic discharge rails (e.g., for the cases shown in FIGS. 1A and 1B). Note that in FIGS. 3A-3B, similar or identical parts or elements are indicated by identical reference numerals. The circuit 250 shown in FIG. 3A represents a first example of a discharge protection system and the circuit 251 shown in FIG. 3B represents a second example of a discharge protection system. Circuit 251 provides a circuit configuration that is a variation to the circuit 250.

In the circuit 250 shown in FIG. 3A, an input pin 252 is coupled to a transistor 254 (e.g. an NMOS transistor), which in turn can be coupled to an output pin 256. The transistor 254 can be further connected to the input of a diode 264 ($D_G$) whose output engages an electrostatic discharge rail 265. A resistor 262 (Rgc) is also connected to the transistor 254 and the input to the diode 264. The resistor 262 can function as a gate control resistor. A gate control circuit 260 can be also coupled to the resistor 262. A ground terminal 266 is also shown with respect to circuit 250 (and also circuit 251 in FIG. 3B).

In circuit 251 shown in FIG. 3B, an additional diode 267 ($D_D$) can be provided whose input is coupled to the transistor 254 and to a circuit 276 (CKT). The output of the diode 267 connects to the output of the diode 264 and the electrostatic discharge rail 281. The diode 264 can function as a gate diode with respect to the gate of transistor 254.

FIGS. 3A-3B demonstrate that an ESD protection is connected to the gate net of the switch. This ESD protection can be an AC or DC ESD protection. The resistor 262 can be placed between the gate control circuit 260 and the gate net (where the ESD protection is placed) as shown in FIG. 3A. The resistor 262 can be added in series from the gate of the transistor 254 to the gate control circuit 260 (Rcg) to limit the current that goes to the gate control circuit 260. This can increase Vg (safe) and decrease the size of the clamp device. The diode 264 connected to the (pre-biased) electrostatic discharge rail 265 can also be used as shown in FIG. 3A for AC electrostatic discharge protection (e.g., rail clamps).

The electrostatic discharge protection on the gate net can be selected such that under a fast system level electrostatic discharge event, such as found in the IEC immunity standard 61000-4-2 on electrostatic discharge, the gate net can be clamped to a voltage where the source node circuitry can survive the electrostatic discharge event. If an instantiation using a pre-biased electrostatic discharge rail is applied, the diode 264 between the source net and the pre-biased electrostatic discharge rail 265 can be used as shown in FIG. 3A.

Additionally, the electrostatic discharge protection on the data line (the drain/source side of the transistor 254) can potentially be reduced in size, which facilitates improvements in the bandwidth performance of the overall circuit. Simulations with ESD transients can be used to tune the ESD protections on the data line. In addition, the drain (and source) of the transistor 254 can be connected to the electrostatic discharge rail 281 using a diode ($D_D$) such as the diode 267 shown in FIG. 3B. The diode 267 can be added to clamp the voltage on the drain of the transistor 254. The diode 267 generally operates as a drain diode (i.e., with respect to the drain of the transistor 254), among other functions.

The gate can also be connected to the electrostatic discharge rail 281 using the diode 267. The diode 267 can be added to the circuit 251 to clamp the voltage on the gate. The electrostatic discharge rail 281 can be shared for the diode 264 (e.g., a gate diode) and the diode 267 (e.g., a drain diode) as shown in FIG. 3B. The rail clamp can be dedicated or shared, which means that the electrostatic discharge rail 281 can also be dedicated or shared, depending on the requirements of the particular system application or layout limitations. In addition, the sizes of the diodes 264 and 267 and the resistor 262 may vary and can be optimized, depending on the use case. Additionally, whether or not the electrostatic discharge rail 281 is dedicated or shared depends on the practical limitations of the layout.

Table (1) below shows possible conditions of high-speed pins/circuitries using the disclosed embodiments. Note that in Table (1), "DG" refers to "Drain to Gate", "DD" refers to "Drain to Drain", and "RGC" refers to a "Gate Control" resistor.

| | DG | DD | RGC | Electrostatic Discharge Rail | Shared Group |
|---|---|---|---|---|---|
| CC DT | x | No (covered by a dedicated drain protection) | x (supply) | Shared | 1 |
| RXTX | x | x | x (supply) | Shared | 1 |
| VCONN | x | No (covered by a dedicated drain protection) | x (supply) | Dedicated | NA |
| FRS | x | x | No | Shared | 1 |
| JTAG | x | x (main ESD (pin)) | x | Shared | 1 |
| D+/−, $S_{BU}$ SW | x | x (main ESD (pin)) | No | Dedicated | for D+/− |
| $S_{BU}$ SW | x | x (main ESD (pin)) | No | Dedicated | for SBU |

Figure 4:
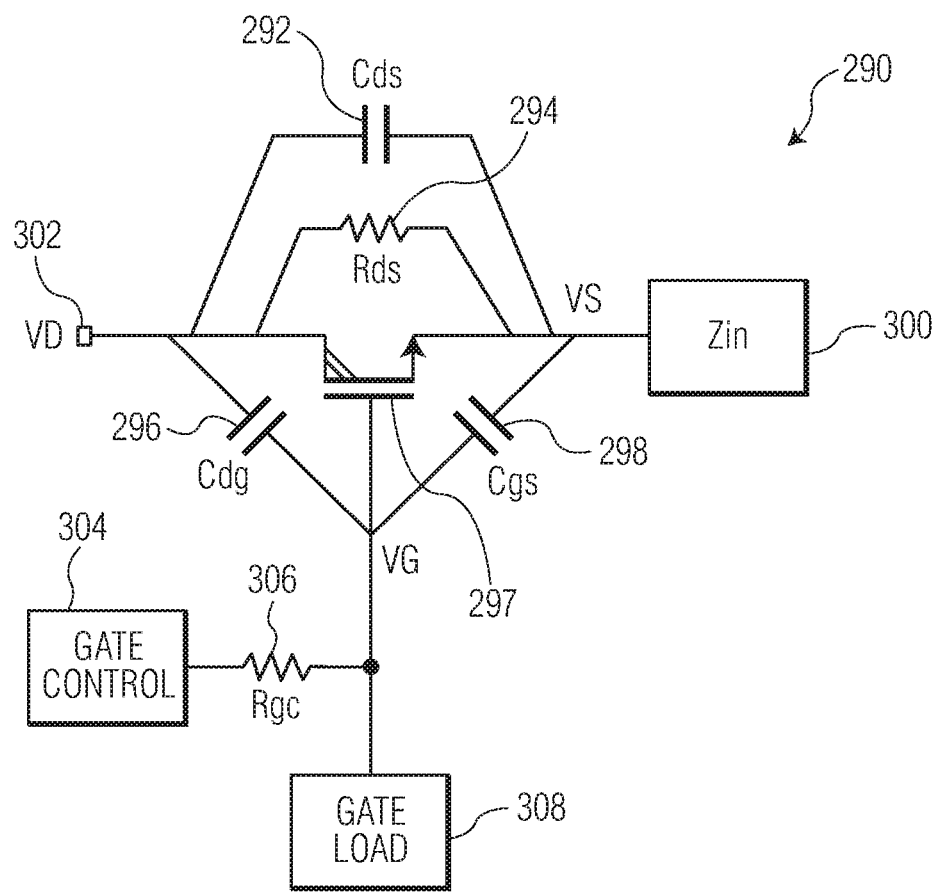
FIG. 4 depicts a schematic diagram of a circuit based on a transistor model with major parasitic components shown.

FIG. 4 depicts a schematic diagram of a circuit 290 based on a transistor model with major parasitic components shown. The circuit 290 can be modeled to include a capacitor 292 (Cds) in parallel with a resistor 294 (Rds). The capacitor 292 and the resistor 294 can connect to a voltage input 302 (VD) and the input to an impedance element (Zin) 300 at VS. A capacitor 296 (Cdg) functions as a drain to gate capacitor (i.e., with respect to the drain and gate of transistor 297) and a capacitor 298 (Cgs) functions as a gate to source capacitor (i.e., with respect to the gate and source of transistor 297). Capacitors 296 and 298 can also connect to a resistor 306 (Rgc) and a gate load 308.

The resistor 306, which functions as a gate control resistor, can also be connected to a gate control circuit 304. Note that "Cdg" can refer to a drain to gate capacitor, "Cgs" can refer to a gate to source capacitor, and "Cds" can refer to a drain to source capacitor. "Rgc" refers to a gate control resistor and "Rds" can refer to a drain to source resistor.

When the transistor 297 is large (such as shown in FIG. 4), the parasitic is also large. A "very simple" model can ignore the transistor 297 and deals with parasitic features in a "FAST Surge" event. Two cases are possible—when the switch is "OFF" and when the switch is "ON". That is, when the switch is "OFF" (e.g., for a high speed switch case or for a surge event during power up), the resistor 294 (Rds) is large. The switch is "ON" for high-speed cases, wherein, Rds~few ohm, and for common source protection circuits, wherein Rds~few 10s of ohm.

The model shown in FIG. 4 thus employs parasitic capacitance between the gate and drain of the transistor 297 (the same is true for the transistor 254 shown in FIGS. 3A-3B), and offers strong electrostatic discharge performance for fast transient signals because of the direct capacitive coupling facilitated by, for example, the capacitor 292.

Figure 5A:
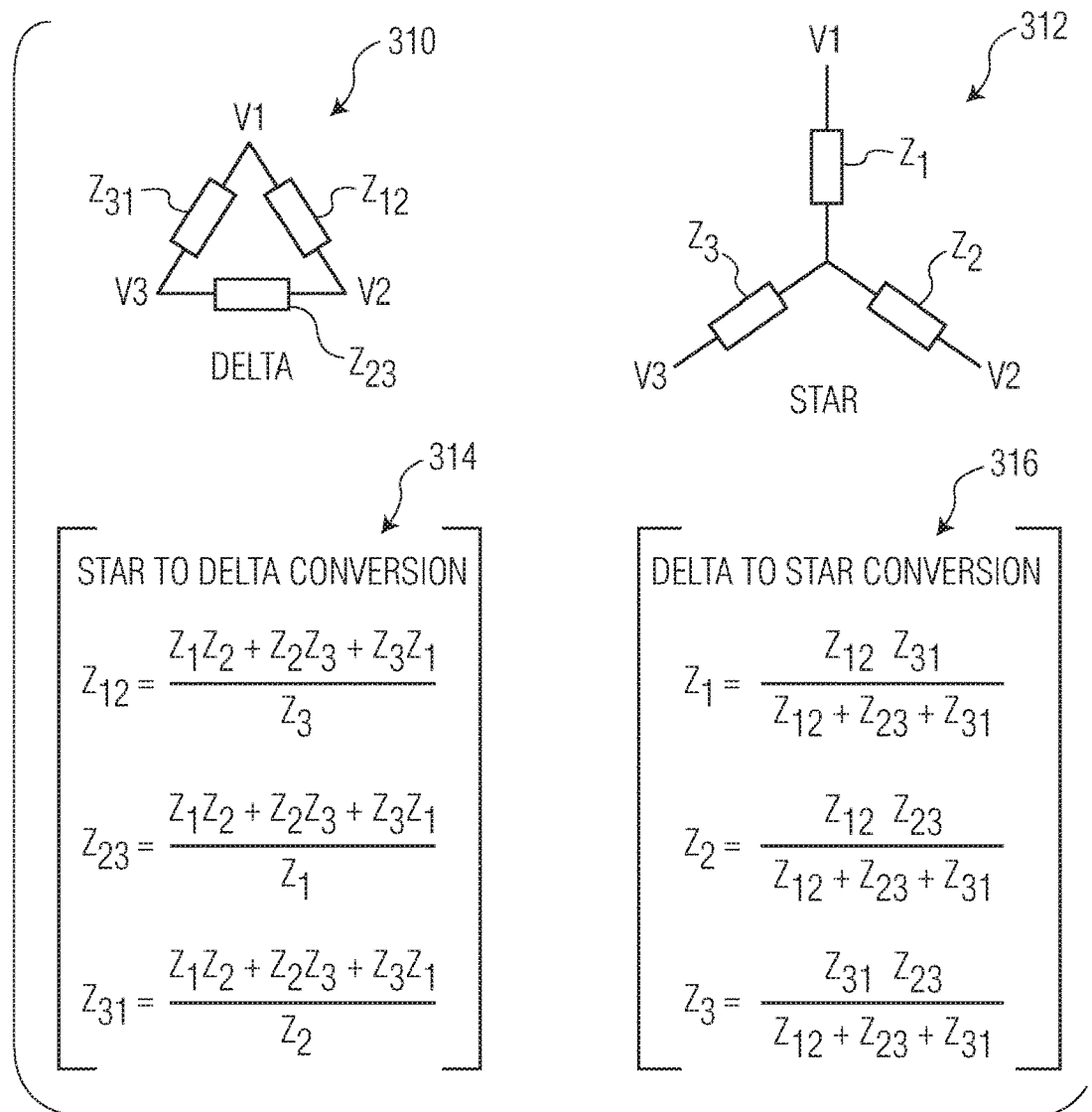
FIG. 5A depicts schematic diagrams of respective delta and star models and associated conversion equations.
Figure 5B:
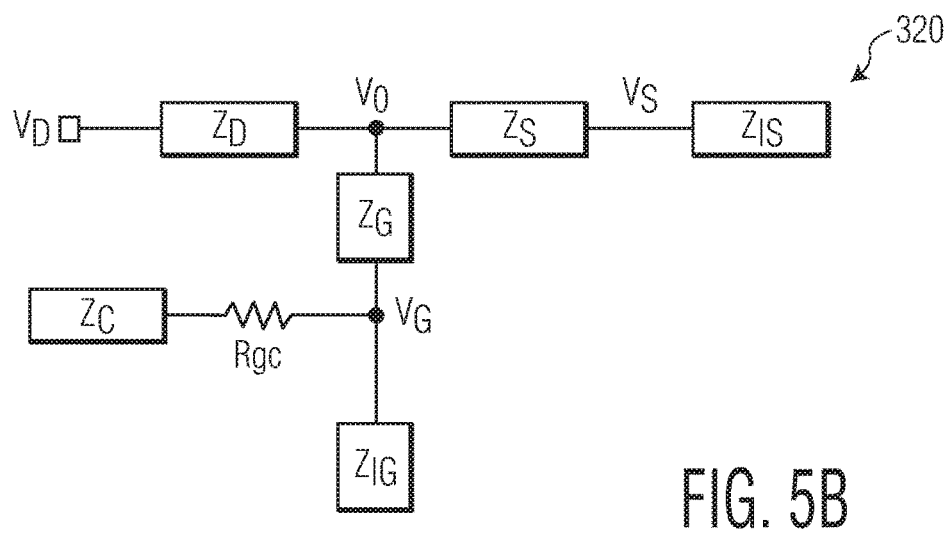
FIG. 5B depicts a schematic diagram of a simplified transistor model with proper loading.

FIG. 5A and FIG. 5B depict schematic diagrams of respective delta and star models 310 and 312 and associated conversion equations 314 and 316, along with a simplified transistor model 320 with proper loading. Considering voltages $V_1=V_G$, $V_2=V_S$, $V_3=V_D$, a transistor is a "Delta impedance model" and can change to a "Star Impedance" Model.

FIGS. 5A-5B illustrate simplified models that consider a variety of impedances. The model shown in FIG. 5A and FIG. 5B demonstrates how any ΔV (i.e., change in voltage) at the drain can be transferred to the gate and source of, for example, the transistor 297 shown in FIG. 4 and can harm the transistor if not clamped properly. Note that in these models, the parameter "V" can refer to voltage, the parameter "Z" cam refer to impedance, and the parameter "I" can refer to current. The resistor 294 (Rgc) shown in FIG. 4 is the added resistor (i.e., the gate control resistor) discussed earlier. Considering:

$$V_1 = V_G, V_2 = V_S, V_3 = V_D$$

Voltages at Nodes $V_D$, $V_S$, $V_G$ can be calculated as follow:

$$V_S = V_0 * Z_{IS}/(Z_S + Z_{IS})$$

$$V_G = V_0 * (Z_{IG} \| (Rcg + _ZC))/(Z_G + (Z_{IG} \| (Rcg + Z_C)))$$

Where:

$$V_0 = V_D * (Z_S + Z_I) \| (Z_G + (Z_{IG} \| (Z_C + Rcg))) / (Z_D + (Z_S + Z_I) \| (Z_G + (Z_{IG} \| (Z_C + Rcg))))$$

$$I_C = V_G * Z_C/(Z_C + Rcg)$$

This means that when, for example, the Rgc increases, $I_C$ decreases. This is a feature that can be used to protect a gate control circuit, such as, for example, the gate control circuit 304 shown in FIG. 4 and the gate control circuit 260 shown in FIGS. 3A and 3B. The equations above also indicate that the larger the resistance of Rcg, the better. In other words, a high impedance path is generally better. Although in some cases, this may not be the case, because the voltage at the gate of the transistor will be increased for a high impedance case.

If a "low impedance" path is present when Vg>Vg, the "safe" feature is desired. A similar argument is valid for $V_D$—that is, if a low impedance path is present when $V_D$>$V_D$, a "safe" feature is also desired. Note that if a maximum voltage limitation is "on" and between nodes during electrostatic discharge and surge events, the impedances can be used to calculate how much voltage will fall over each node and if the voltage will remain in a safe range. If the impedance is too high, a protection feature should be added.

Note that the term "maximum voltage" can refer to the voltage at which an electrical or electronic device, circuit, component, or element can retain its properties during its lifetime and in the recommended environment and usage parameters. This may be lower than the maximum allowable voltage, for example, in testing. The term "maximum voltage" may also refer to the absolute maximum rated voltage that can be applied to an electrical or electronic device, circuit, component, or element, beyond which damage (latent or otherwise) may occur.

Figure 6A:
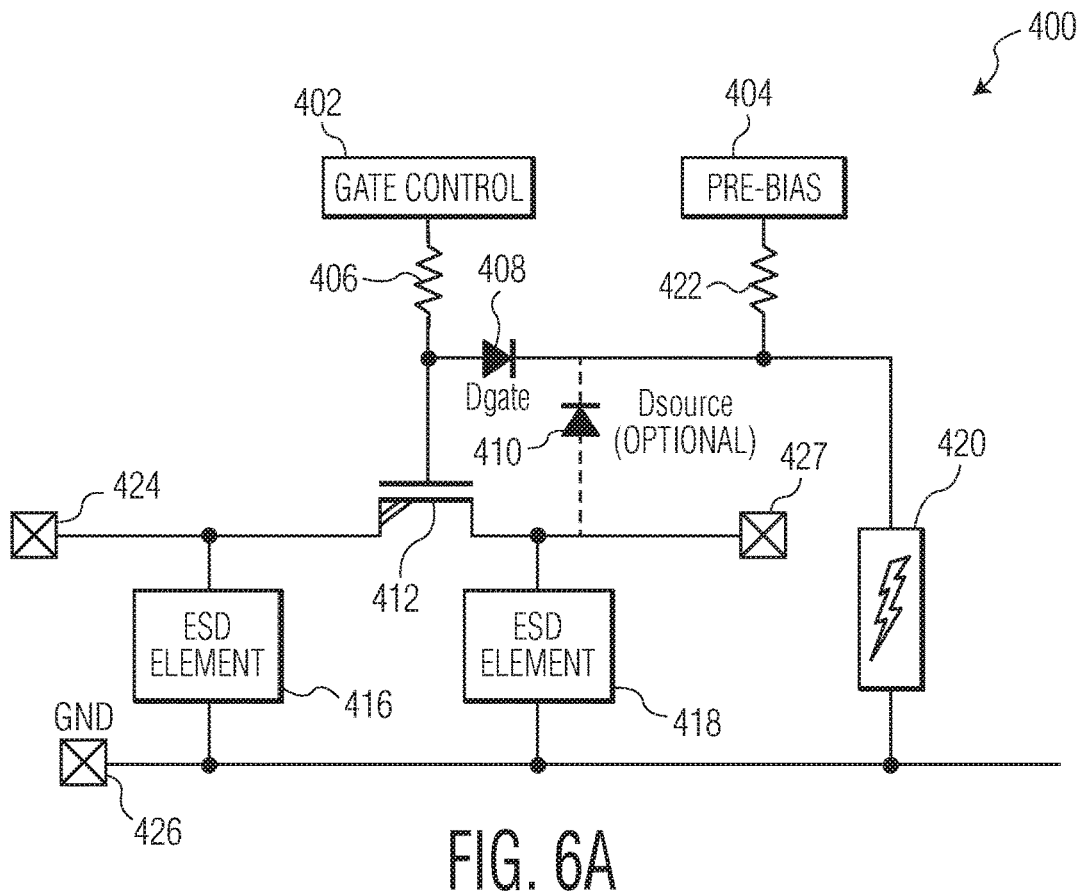
FIG. 6A depicts a schematic diagram of a circuit having a switch configuration with electrostatic discharge protection including a gate diode.

FIG. 6A depicts a schematic diagram of a circuit 400 having a switch configuration with electrostatic discharge protection including a gate diode. The circuit 400 can include a gate control element 402 that is coupled to resistor 406, which in turn connects to a diode 408 and the gate of a transistor such as MOS device 412. The circuit 400 can be implemented in a discharge protection circuit.

The diode 408 can further connect to a resistor 422 and an ESD protection element, which may be a DC or AC triggered ESD protection component or sub-circuit. The diode 408 can thus connect to a DC or AC triggered ESD protection element 420 and to the output of an optional source diode 410, which may in turn can connect to a low voltage pin 427, the source of the MOS device 412 and to an electrostatic discharge element 418 (i.e., which offers the ESD solution described herein). The resistor 422 can also connect to a pre-bias element 404.

Thus, in the configuration shown in FIG. 6A, the diode 408 can be implemented from the gate net to a pre-biased net (i.e., from the gate control element 402 and resistor 406 to the resistor 422 and the pre-bias element 404).

The drain of the MOS device 412 can be connected to a high voltage pin 424 and also to another electrostatic discharge protection element 416. The electrostatic discharge protection element 416, the electrostatic discharge protection element 418, and the DC or AC triggered electrostatic discharge protection element 420 can be further connected to ground 426.

Figure 6B:
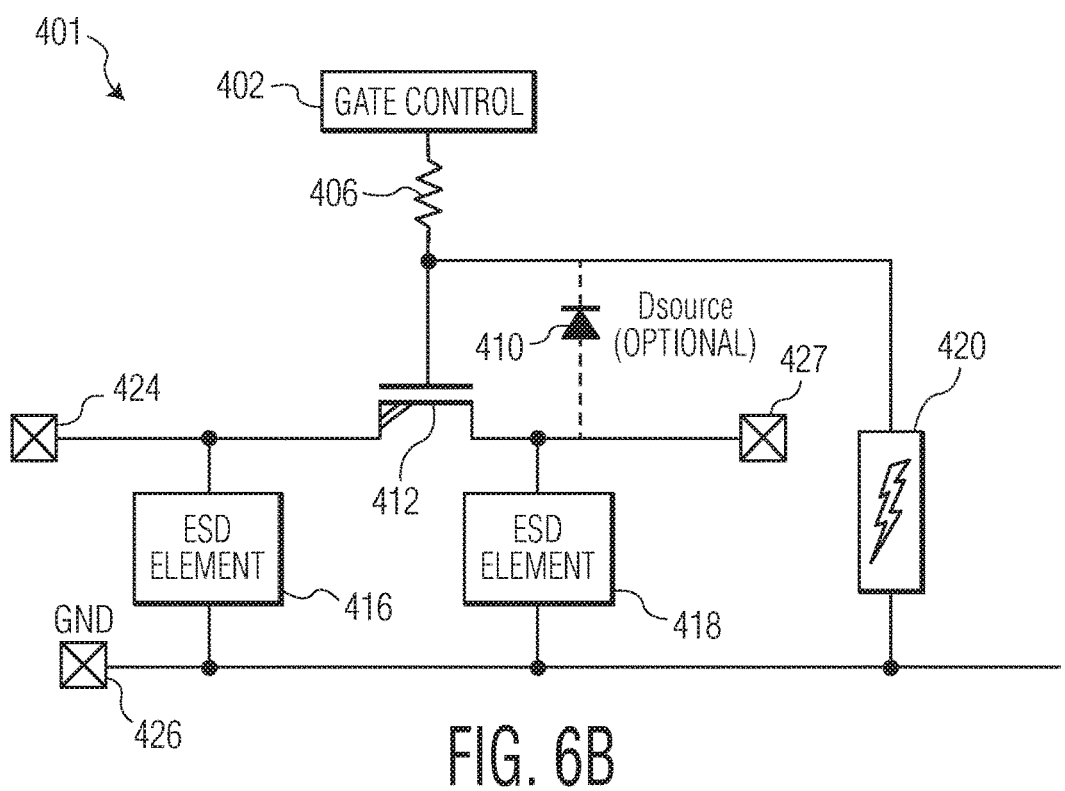
FIG. 6B depicts a schematic diagram of a circuit having a switch configuration with electrostatic discharge protection that does not include a gate diode.

FIG. 6B depicts a schematic diagram of a circuit 401 having a switch configuration with electrostatic discharge protection that does not include a gate diode. The circuit 401 can be implemented in a discharge protection circuit. Note that in FIGS. 6A, 6B, 7A, and 7B, identical or similar components or elements are generally indicated by identical reference numerals. Circuit 401 shown FIG. 6B is a modified version of the circuit 400 shown in FIG. 6A. In circuit 401, the diode 408 that was included in circuit 400 has now been removed with respect to the gate control element 402, meaning that the electrostatic discharge protection element can be directly connected to the gate net.

Figure 7A:
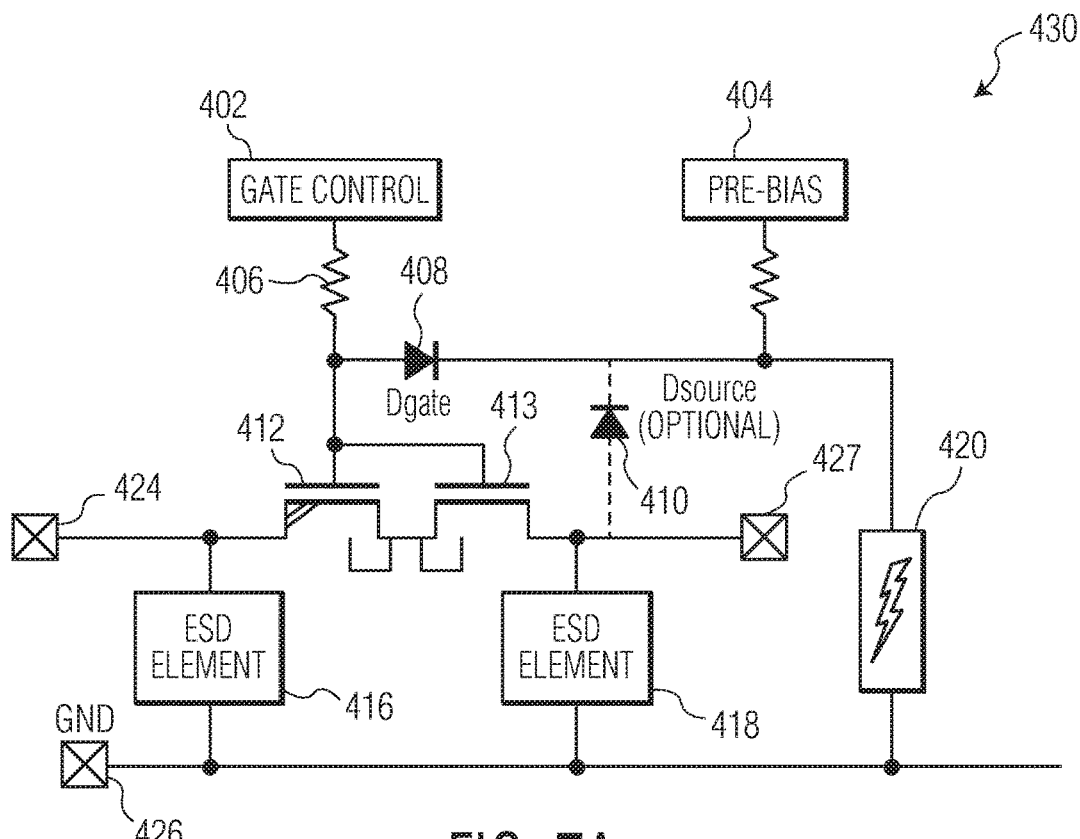
FIG. 7A depicts a schematic diagram of a circuit having a back-to-back switch configuration with electrostatic discharge protection at the gate net and including a gate diode.

FIG. 7A depicts a schematic diagram of a circuit 430 having a back-to-back switch arrangement with electrostatic discharge protection at the gate net and including the diode 408 (which can function as a gate diode). In circuit 430, the diode 408 can connect from the gate net to the pre-biased net (similar to the arrangement shown in FIG. 6A). The circuit 430 shown in FIG. 7A is a modified version of the previously illustrated circuits 400 and 401.

In the configuration shown in FIG. 7A, circuit 430 includes a group of transistors including the MOS device 412 and another MOS device 413, which are connected to one another via their respective gates. The circuit 430 can be implemented in a discharge protection circuit. In addition, the gates of the MOS device 412 and the MOS device 413 can connect to the diode 408. The source of the MOS device 413 can connect to the low voltage pin 427 and the drain of the MOS device 412 can connect to the high voltage pin 424. Note that in some embodiments, the MOS device 412 shown in FIG. 7A can be implemented as an HV (High Voltage) MOS device. The MOS device 413 can be an HV or LV (Low Voltage) MOS device. In the configuration shown in FIG. 7A, the MOS device is shown as an LV device (but may be provided as an HV device in other configurations).

Figure 7B:
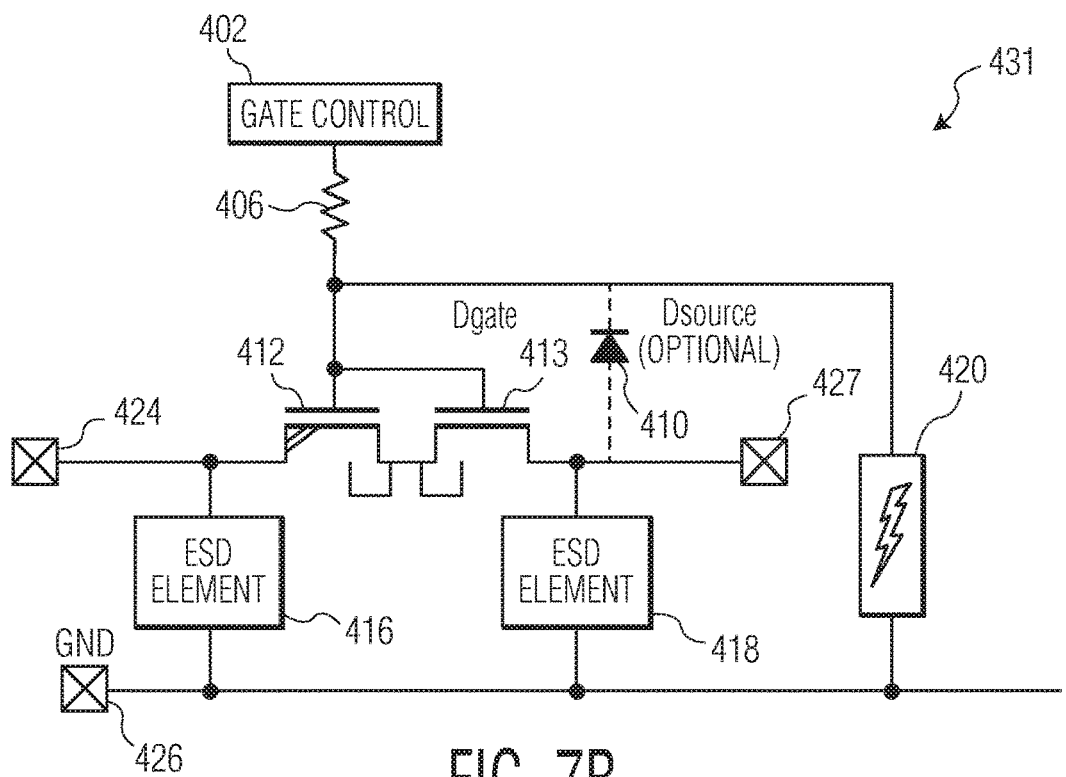
FIG. 7B depicts a schematic diagram of a circuit having a back-to-back switch configuration with electrostatic discharge protection at the gate net that does not include a gate diode.

FIG. 7B depicts a schematic diagram of a circuit 431 having a back-to-back switch configuration (i.e., a back-to-back arrangement) with electrostatic discharge protection at the gate net that does not include a gate diode. That is, circuit 431 does not include the diode 408 that is utilized in circuit 430. In circuit 431, the resistor 406 can connect to the optional source diode 410 and the triggered electrostatic discharge protection element 420, which can be configured as an AC-triggered electrostatic discharge protection element or a DC-triggered electrostatic discharge protection element. FIG. 7A and FIG. 7B thus illustrate the situation in which the switch can be configured from two MOS devices 412 and 413 in a back-to-back arrangement. This type of configuration can be implemented in the context of, for example, a USB switch (e.g., CC1/CC2). The circuit 431 can be implemented in a discharge protection circuit.

Thus, FIG. 6A and FIG. 6B illustrate a switch circuit configuration (respectively, with and without a diode for electrostatic discharge protection at the gate net), and FIG.

7A and FIG. 7B depict a double switch circuit configuration (a back-to-back arrangement or configuration, respectively with and without the gate diode, to facilitate electrostatic discharge protection at the gate net). FIGS. 6A-6B and 7B-7B depict alternative embodiments of the configurations shown in FIGS. 3A and 3B.

Figure 8:
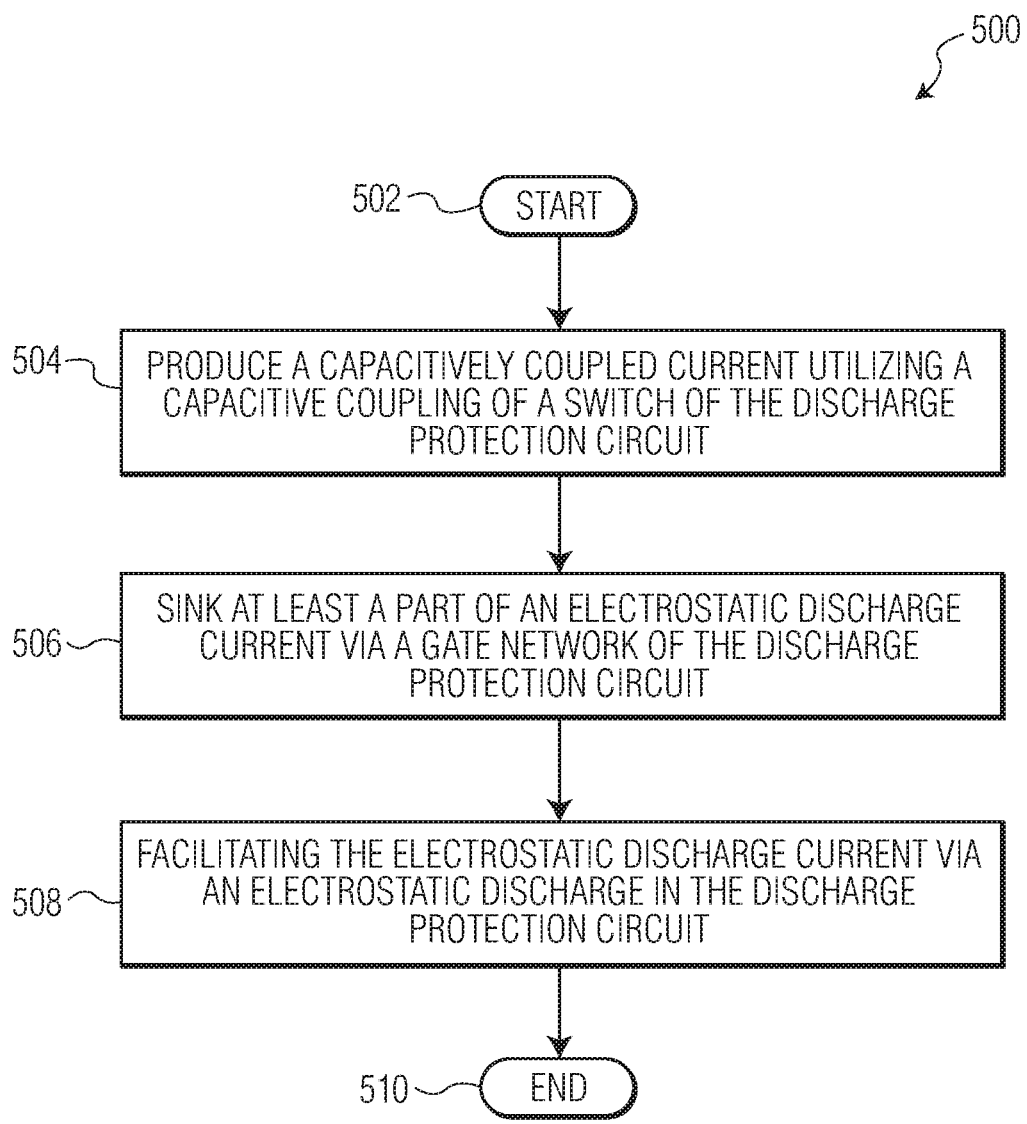
FIG. 8 depicts a process flow diagram of a method of operating a discharge protection circuit.

FIG. 8 depicts a process flow diagram of a method 500 of operating a discharge protection circuit. As shown at block 502, the process can be initiated. Then, as indicated at block 504, a step or operation can be implemented to produce a capacitively coupled current utilizing a capacitive coupling of a switch configured with the capacitive coupling between a gate and a drain of the switch. Next, as depicted at block 506, a step or operation can be implemented to sink at least a part (or all) of an electrostatic discharge current via a gate network of the discharge protection circuit. As discussed previously, such a gate network can include at least the gate of the switch, a gate control element and a resistor connected to the gate and the gate control element. Thereafter, as illustrated at block 510, the electrostatic discharge current is facilitated by an electrostatic discharge rail in the discharge protection circuit that connects to a diode coupled to the aforementioned gate and resistor. The discharge protection circuit may be the same as or similar to the discharge protection circuits discussed previously herein, and may be implemented in the context of a discharge protection system.

Based on the foregoing, it can be appreciated that the disclosed approach can employ a capacitive coupling (e.g., such as, the capacitors 292, 296, and 296 shown in FIG. 4) that sinks a part of (or all of) the electrostatic discharge current via the disclosed gate net. This approach is particularly effective for fast electrostatic discharge events, such as specified by IEC 61000-4-2, since the coupling to the gate net is then the strongest. The disclosed gate network features an AC-triggered or DC-triggered electrostatic discharge protection element (e.g., the DC or AC triggered electrostatic discharge protection element 420) that sinks the capacitively coupled current. Such an electrostatic discharge protection feature may not interfere with the gate network's functional operations.

An important benefit of the disclosed embodiments is the indirect clamping of the source side of the switch (since the source may not rise above the clamping voltage of the gate net minus the threshold voltage, Vth). Another benefit is that this approach may not load the data line, and therefore may not compromise a potentially high bandwidth performance of the switch.

The disclosed approach provides a solution that can protect circuits connected to, for example, a Type-C connector (e.g., "CC" pin). This approach can also be utilized to protect a circuit supply from surge damage. A combination of diode, resistor and a dedicated or shared rail clamped (which is AC and DC triggered) can facilitate the goal of electrostatic discharge protection in a manner that can limit the voltage rise at the source of the switch and can also allow for a smaller electrostatic discharge protection on the actual drain and source net of the switch, which in turn can facilitate a more aggressive bandwidth performance (e.g., less capacitance on the data line).

The disclosed approach can also avoid overvoltage at the gate net (e.g., when a DC protection is used), which can improve the overall robustness of the IC chip in which the circuit is deployed and reduces the risks of electrical overstress (EOS). Additionally, the disclosed solution can use the (parasitic) capacitances of the (HV) MOS switch device and is therefore relatively area efficient (i.e., certainly, in comparison with the additional area that may be needed for electrostatic discharge protection at the source side of the switch, if the disclosed approach is not applied).

The disclosed approach can also handle very fast electrostatic discharge transients, because of the direct capacitive coupling to the gate net. This also reduces the chances for electrical overstress (EOS). Additionally, the disclosed approach can clamp surge voltages at internal nodes of an IC chip and can also protect circuits facing pins with potentially high voltage slow surge. The disclosed approach additionally can reduce the need for an expensive external TVS (Transient Voltage Suppressor) or remove the need for an external TVS. The disclosed embodiments can be fully integrated and take up very little area.

Although the operations of the method(s) and elements of the circuit(s) and system(s) herein are shown and described in a particular order or configuration, the order of the operations and elements of the method, circuit and system may be altered so that certain operations or elements may be performed in an inverse or different order or arrangement or so that certain operations may be performed, at least in part, concurrently with other operations. In another embodiment, instructions or sub-operations of distinct operations or elements may be implemented in an intermittent and/or alternating manner.

Alternatively, embodiments of the invention and elements thereof may be implemented in hardware or in an implementation containing hardware and software elements. In embodiments that utilize software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A discharge protection circuit, comprising:
a switch having a capacitive coupling between a gate and a drain of the switch, wherein the capacitive coupling facilitates a capacitively coupled current;
a diode;
a gate control element coupled to the gate of the switch and to a first end of the diode;
an electrostatic discharge rail coupled to a second end of the diode, and
an electrostatic discharge protection element coupled directly between the electrostatic discharge rail and a ground;
wherein the capacitive coupling is configured to sink at least a part of an electrostatic discharge current to the ground via the diode, the electrostatic discharge rail and the electrostatic discharge protection element.

2. The circuit of claim 1 wherein the electrostatic discharge protection element is an AC-triggered electrostatic discharge protection element.

3. The circuit of claim 1 wherein the electrostatic discharge protection element is a DC-triggered electrostatic discharge protection element.

4. The circuit of claim 1 further comprising a second diode coupled between a source side of the switch and the electrostatic discharge rail.

5. The circuit of claim 1 wherein the switch comprises an MOS device.

6. The circuit of claim 1 wherein the electrostatic discharge rail comprises a shared rail that is shareable by at least one other circuit.

7. The circuit of claim 1 wherein the capacitive coupling includes a discrete capacitor.

8. A method of operating a discharge protection circuit, comprising:
producing a capacitively coupled current utilizing a capacitive coupling of a switch configured with the capacitive coupling between a gate and a drain of the switch,
sinking at least a first part of an electrostatic discharge current via an electrostatic discharge rail coupled to the gate with a first diode and an electrostatic discharge protection element coupled directly between the electrostatic discharge rail and a ground; and
sinking a second part of the electrostatic discharge current via a second diode coupled between the electrostatic discharge rail and a source side of the switch using the electrostatic discharge protection element coupled directly between the electrostatic discharge rail and the ground.

9. The method of claim 8 further comprising an AC-triggered electrostatic discharge protection element that sinks the capacitively coupled current.

10. The method of claim 8 further comprising a DC-triggered electrostatic discharge protection element that sinks the capacitively coupled current.

11. The method of claim 8 further comprising an indirect clamping of the source side of the switch.

12. The method of claim 8 wherein the switch comprises an MOS device.

13. The method of claim 8 wherein the electrostatic discharge rail comprises a shared rail that is shareable by at least one other circuit.

14. The method of claim 8 wherein the capacitive coupling includes a discrete capacitor.

15. A discharge protection system, comprising:
a circuit comprising a switch that includes at least one transistor, wherein the switch comprises a capacitive coupling between a gate and a drain of the at least one transistor, wherein the capacitive coupling facilitates a capacitively coupled current;
a diode;
a gate control element coupled to the gate of the at least one transistor and a first end of the diode;
an electrostatic discharge rail coupled to a second end of the diode, and
an electrostatic discharge protection element coupled directly between the electrostatic discharge rail and a ground;
wherein the capacitive coupling facilitates sinking of at least a part of an electrostatic discharge current to the ground via the diode, the electrostatic discharge rail and the electrostatic discharge protection element;
a second diode coupled between a source side of the at least one transistor and the electrostatic discharge rail.

16. The system of claim 15 further comprising an electrostatic discharge protection element configured to sink the capacitively coupled current.

17. The system of claim 15 wherein the at least one transistor includes a plurality of MOS devices in a back-to-back arrangement, wherein the plurality of MOS devices comprises at least two MOD devices configured in the back-to-back arrangement.

18. The system of claim 15 wherein the electrostatic discharge rail comprises a shared rail that is shareable by at least one other circuit and wherein the capacitive coupling includes a discrete capacitor.

* * * * *